US010837824B2

(12) United States Patent
Holtmannspötter et al.

(10) Patent No.: US 10,837,824 B2
(45) Date of Patent: Nov. 17, 2020

(54) MONITORING AN ASSET USING GÖRTZEL FILTERS

(71) Applicant: epro GmbH, Gronau (DE)

(72) Inventors: Hermann Holtmannspötter, Ochtrup (DE); Matthias Holtmannspötter, Ochtrup (DE); Thomas Franz Wewers, Stadtlohn (DE)

(73) Assignee: EPRO GMBH (DE)

( * ) Notice: Subject to any disclaimer, the term of this patent is extended or adjusted under 35 U.S.C. 154(b) by 207 days.

(21) Appl. No.: 15/287,982

(22) Filed: Oct. 7, 2016

(65) Prior Publication Data

US 2018/0100761 A1   Apr. 12, 2018

(51) Int. Cl.
| | |
|---|---|
| *G06F 12/14* | (2006.01) |
| *G01H 1/00* | (2006.01) |
| *G06F 17/14* | (2006.01) |
| *H03H 17/02* | (2006.01) |
| *H03H 17/04* | (2006.01) |

(52) U.S. Cl.
CPC .............. *G01H 1/00* (2013.01); *G01H 1/003* (2013.01); *G06F 17/141* (2013.01); *H03H 17/0213* (2013.01); *H03H 17/04* (2013.01)

(58) Field of Classification Search
CPC ............................ G05B 23/024; F03B 7/0296
USPC ........................................................ 702/182
See application file for complete search history.

(56) References Cited

U.S. PATENT DOCUMENTS

| | | | | |
|---|---|---|---|---|
| 6,098,022 | A * | 8/2000 | Sonnichsen | G01M 13/028 702/190 |
| 2003/0220767 | A1* | 11/2003 | Wegerich | G05B 23/024 702/182 |
| 2012/0043758 | A1* | 2/2012 | Esbensen | F03D 7/0296 290/44 |

* cited by examiner

*Primary Examiner* — Lam S Nguyen
(74) *Attorney, Agent, or Firm* — Luedeka Neely Group, P.C.

(57) ABSTRACT

An apparatus monitors physical signals, such as vibration, produced by an asset, such as a motor. Sensor signals corresponding to the physical signals are applied to a bandpass Görtzel filter that passes a frequency band around a characteristic frequency of a physical signal. An analyzer produces information corresponding to the physical condition of the asset based on the Görtzel filtered signal. A tracking unit periodically updates parameters of the Görtzel filter so that the bandpass frequencies of the Görtzel filter track the characteristic frequency of the physical signal. Each Görtzel filter may include a comb filter whose output is applied to a plurality of resonators, whose outputs are applied to a windowing unit. The Görtzel filter is preferably a Görtzel filter block that is made up of a plurality of individual Görtzel filters. The tracking unit continuously updates the operating characteristics of the multiple Görtzel filters within the Görtzel filter block such that one Görtzel filter has a bandpass center frequency at the characteristic frequency and other Görtzel filters have center frequencies that are immediately above and immediately below the characteristic frequency. Thus, if the characteristic frequency changes up or down, the shifted Görtzel filters will pass those frequencies, and the signal at the actual characteristic frequency will not be lost.

22 Claims, 5 Drawing Sheets

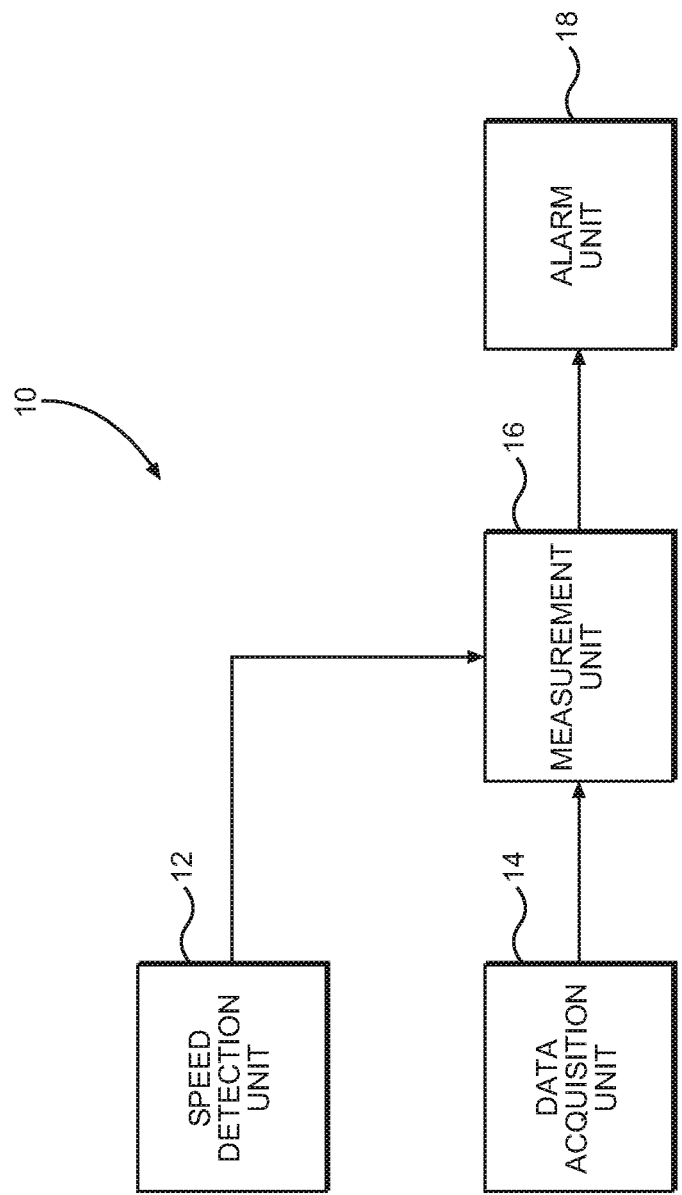

MONITORING AN ASSET USING GÖRTZEL FILTERS

FIELD

The present invention relates to the field of monitoring physical assets such as machines and motors and particularly relates to monitoring physical assets for purposes of protecting, controlling and/or maintaining the assets

BACKGROUND

In many industrial settings, is important to carefully monitor assets for the purposes of controlling the assets, predicting failures or abnormal operations, maintaining and protecting the assets. For example, a failure of the turbine in a power generation plan would be expensive and possibly dangerous. Thus, the turbine is electronically monitored in a variety of ways for purposes of controlling the turbine, predicting when the turbine might fail or operate abnormally, protecting the turbine from operating abnormally or catastrophically failing, and determining maintenance requirements of the turbine before the turbine actually fails. One technique for monitoring the turbine would be to monitor vibration at various points on the turbine. The frequency, amplitude and phase of the vibration can provide information as to the operating condition of the turbine, including an abnormal operating condition of the turbine. Using that information, the electronics can protect the turbine by detecting an abnormal operating condition and either shutting it down or operating it in a reduced capacity. The information can also be used to identify developing problems with the turbine and schedule future maintenance to correct the problems before the problem becomes sufficiently severe to cause a failure.

One technique for monitoring vibration is to place displacement sensors on the assets and analyze the sensor signals. Fast Fourier transforms are often used to convert the sensor signals to the frequency domain and then the frequency domain signals are analyzed to identify abnormal vibration or determine a possible cause of abnormal vibration. For example, if a machine is experiencing a relatively large vibration at a frequency that is a multiple of the rotational speed of the machine, it may indicate that a bearing is cracked. The physical characteristics of the bearing, such as the number of rollers in a roller bearing, will cause the bearing to click or vibrate multiple times during a single rotation. Thus, knowledge of the number of rollers in a rolling bearing and the speed at which the shaft is turning may be used to predict the frequency of vibration caused by a crack in a bearing. If that particular frequency is detected or observed in a frequency spectrum produced by a Fast Fourier transform, the operator may decide that bearing is probably cracked.

In some situations, the Fast Fourier transform may be perceived as being too slow for an analysis of a particular sensor signal. Also, Fourier transforms require significant processing power which may not be available or practical in a particular situation. Thus, alternative techniques for analyzing sensor signals from assets are needed.

SUMMARY

The problems with Fast Fourier Transform analysis of signals from assets in some situations is overcome in the present invention by the use of Görtzel filters. In one embodiment, an apparatus for monitoring an asset includes a sensor for sensing physical signals, such as vibration, produced by an asset. These physical signals will often include a characteristic frequency, such as the rotational speed of a machine or a multiple of that rotational speed. A Görtzel filter may be connected to receive the sensor signal and apply a Görtzel filter function to produce a filtered signal. The Görtzel filter is configured to filter the sensor signal and pass a selected frequency band around and including the characteristic frequency. Thus, the filtered signal will correspond to the physical signal and will include signals within a selected frequency band around the characteristic frequency. The filtered signal is then provided to an analyzer that produces information corresponding to the condition of the asset. For example, if the main shaft of the machine is vibrating severely at its characteristic frequency, such as its rotational speed, the analyzer may produce an alert telling the operators that the main shaft of the machine is likely out of balance. If the vibration is of sufficient magnitude, the analyzer may issue a command to shut down the machine.

The Görtzel filter includes a plurality of parameters that are typically stored electronically and such parameters determine the frequencies at which the filter operates. In other words, the parameters dictate the selected frequency band that the filter will pass. The apparatus may include a tracking unit that tracks the characteristic frequency of interest and updates the parameters of the Görtzel filter so that it tracks the characteristic frequency. For example, the characteristic frequency maybe the rotational speed of the machine. The tracking unit will directly or indirectly determine the rotational speed of the machine and will adjust the parameters of the Görtzel filter so that the Görtzel filter will track the characteristic frequency as it changes. Thus, the Görtzel filter will pass a frequency band including the characteristic frequency even as the characteristic frequency changes. The tracking unit may periodically update the parameters at selected time intervals or the tracking unit may periodically update the parameters of the Görtzel filter based on an analysis of the sensor signal. For example, the sensor signal may be composed of a plurality of samples and in such case the tracking unit may count the number of samples and update the parameters each time it counts a selected number of samples. Assuming the sample rate is constant, this technique will cause the tracking unit to update the parameters at constant time intervals. However, the tracking unit may also monitor the filtered signal to determine whether the amplitude, frequency or phase of the filtered signal has changed. If so, the tracking unit may update the parameters of the Görtzel filter. This update technique will typically not cause updates at a constant rate. In other words, the time between updates will vary.

The Görtzel filter may include a plurality of resonators with each resonator set to pass a different frequency band. For example, the Görtzel filter could include five resonators with a center resonator set to pass a frequency at the expected characteristic frequency of interest. Two resonators could be set to pass a frequency that is higher than the expected characteristic frequency and the remaining two resonators may be set to pass a frequency that is lower than the expected characteristic frequency. The resonators may be preceded by a comb filter that is set to pass a frequency band that includes the characteristic frequency of interest has a sufficiently wide frequency band to assure that it will pass the signal of interest even if it varies from the expected characteristic frequency. A windowing unit receives the outputs from the resonators and applies a windowing function, such as a Hanning window, to produce a windowing unit signal in the frequency domain representing a spectrum of frequencies having a peek at or near the expected characteristic frequency.

The Görtzel filter may also be a filter block having a plurality of filters where each filter is a Görtzel filter. For example, each Görtzel filter may include a comb filter whose output is applied to five resonators, and the outputs of the resonators are applied to a Hanning window unit. One Görtzel filter is set to pass signals at the expected characteristic frequency. A plurality of other filters may be set to pass signals at a frequency less than the characteristic frequency and a remaining plurality of filters may be set to pass signals at a frequency greater than the characteristic frequency. All of the outputs from the Görtzel filters are transmitted to a decision unit that produces a decision unit signal corresponding to the output from the Görtzel filters that is most probably the actual characteristic signal.

A speed detector may be provided to measure the rotational speed of the asset and calculate the initial expected characteristic frequency, which is typically either the rotational frequency or a multiple of the rotational frequency. The parameters controlling the operation of the Görtzel filters are set using this expected characteristic frequency. However, the actual characteristic frequency might vary slightly from the expected characteristic frequency and in such case, the output from the Görtzel filter block set to the expected characteristic frequency may be relatively small compared to the output from another Görtzel filter set at a greater or lesser frequency than the characteristic frequency. The decision unit will typically pick the largest output signal from the plurality of Görtzel filters in the block of filters, but other parameters may be used to pick the output signal.

Each of the Görtzel filters may produce a filtered signal in the form of complex output spectrum that includes both amplitude and phase information. The analyzer is configured to monitor both the amplitude and the phase of the filtered signal and will issue information and commands based on the analysis of the amplitude and/or the phase of the filtered signal. In addition, an output unit may receive the filtered signal and using the amplitude and phase information it will reconstruct a sinusoidal signal in the time domain and output it as a representation of the filtered signal which may be used by other components of the electronics that are controlling and monitoring the assets.

In the discussion above, an embodiment was disclosed in which multiple Görtzel filters in a block of filters receive the same input signal. In that embodiment, one sensor signal provides the input signal and the multiple Görtzel filters operate on the same signal and generate different outputs based on the parameters set for each Görtzel filter. Thus, one Görtzel filter may be ultimately selected as the filter must accurately providing the filtered signal of interest at the actual characteristic frequency. However, the multiple Görtzel filters may be configured to operate in multiple modes of operation. In a first mode of operation, the Görtzel filters are set to receive and filter the same input signal, but in a second mode of operation the Görtzel filters are set to receive and filter different input signals, such as signals from different sensors. In the latter embodiment, the output from each Görtzel filter would correspond to a different sensor and a different characteristic frequency. The coefficients or parameters controlling the operation of each Görtzel filter may be very rapidly updated and likewise the inputs to the Görtzel filters can be switched very rapidly. Theoretically, a single Görtzel filters could be updated as rapidly as each new sensor signal sample is provided to the Görtzel filter. Thus, a plurality of Görtzel filters may be configured to monitor a plurality of signals from a plurality of different sensors. Then, when conditions may require it, many or all of the Görtzel filters could be rapidly updated and reconfigured to receive and filter the same sensor signal. This rapid reconfiguration provides flexibility that is useful in a variety of circumstances. For example, if all sensors are generating stable signals, but one sensor suddenly begins to generate erratic sensor signals, it may be useful to monitor the erratic sensor with multiple Görtzel filters so as to assure continued tracking. The remaining stable sensors could be monitored with a lesser number of Görtzel filters or even a single Görtzel filter.

In normal operation the characteristics of each Görtzel filter are established at least initially based upon the speed of a moving asset as determined by the speed detector. So in normal operation a tracking unit will initially set the coefficients or parameters of the Görtzel filter at a frequency based upon the detected speed of the asset. However, where multiple Görtzel filters are used to filter and analyze a single sensor signal, the analyzer may determine that the Görtzel filter set at the expected characteristic frequency was not the most likely signal to represent the actual physical signal at the actual characteristic frequency. Thus, it will select the output from another Görtzel filter and use that output for further analysis. The frequency of the selected Görtzel filter will be transmitted to the tracking unit and that frequency will be used to adjust all of the Görtzel filters. Typically, the frequency of the selected Görtzel filter will be designated as the expected characteristic frequency and all of the Görtzel filters may be adjusted accordingly. Assuming stable conditions, at the next update the expected characteristic frequency and the actual characteristic frequency will be the same. However, if the sensor signal is not stable and the expected characteristic frequency is again different from the actual characteristic frequency that is detected, the update unit will again cause the Görtzel filters to be adjusted based on a new characteristic frequency.

The tracking unit may also update the parameters of the Görtzel filters based on multiple inputs and preprogrammed logic. For example, the tracking unit may receive as inputs a speed signal corresponding to the speed of the asset and it will receive updates from the analyzer as to the actual characteristic frequencies that were detected. Using either or both of these inputs, the tracking unit may calculate a speed gradient and set the characteristic frequency in the Görtzel filters based on both the detected speed and the speed gradient or both the characteristic frequency as determined by the analyzer and the speed gradient. Alternatively, the tracking unit may base its decision on all three factors. So, for example, if an asset is rapidly increasing in speed, the tracking unit will use the speed gradient to predict a future speed that will occur during the entire operation of the Görtzel filters between updates. The speed gradient and the calculated future speeds may be determined based on the speed signal or based on the history of the actual characteristic frequencies as determined by the analyzer, or based on both. For example, if the speed gradient based on the history of actual characteristic frequencies is different from the speed gradient based on the speed signal, the tracking unit may pick one or the other as being most probably reliable, or it may average the two speed gradients, or it may produce a weighted average of the two speed gradients with the more reliable speed gradient being weighted more heavily.

The tracking unit may update the parameters of the Görtzel filters on a regular basis based on time or based on counting the number of sensor samples. However, the tracking unit may also non-periodically update the Görtzel filters. For example, if the speed signal does not change and if the expected characteristic frequency and the actual characteristic frequency are the same, as determined by the analyzer, then the Görtzel filters need not be updated and the update unit may take no action.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1A is a high-level block diagram of an apparatus for monitoring an asset in producing information about the asset, such as an alarm;

DETAILED DESCRIPTION

Figure 1B:
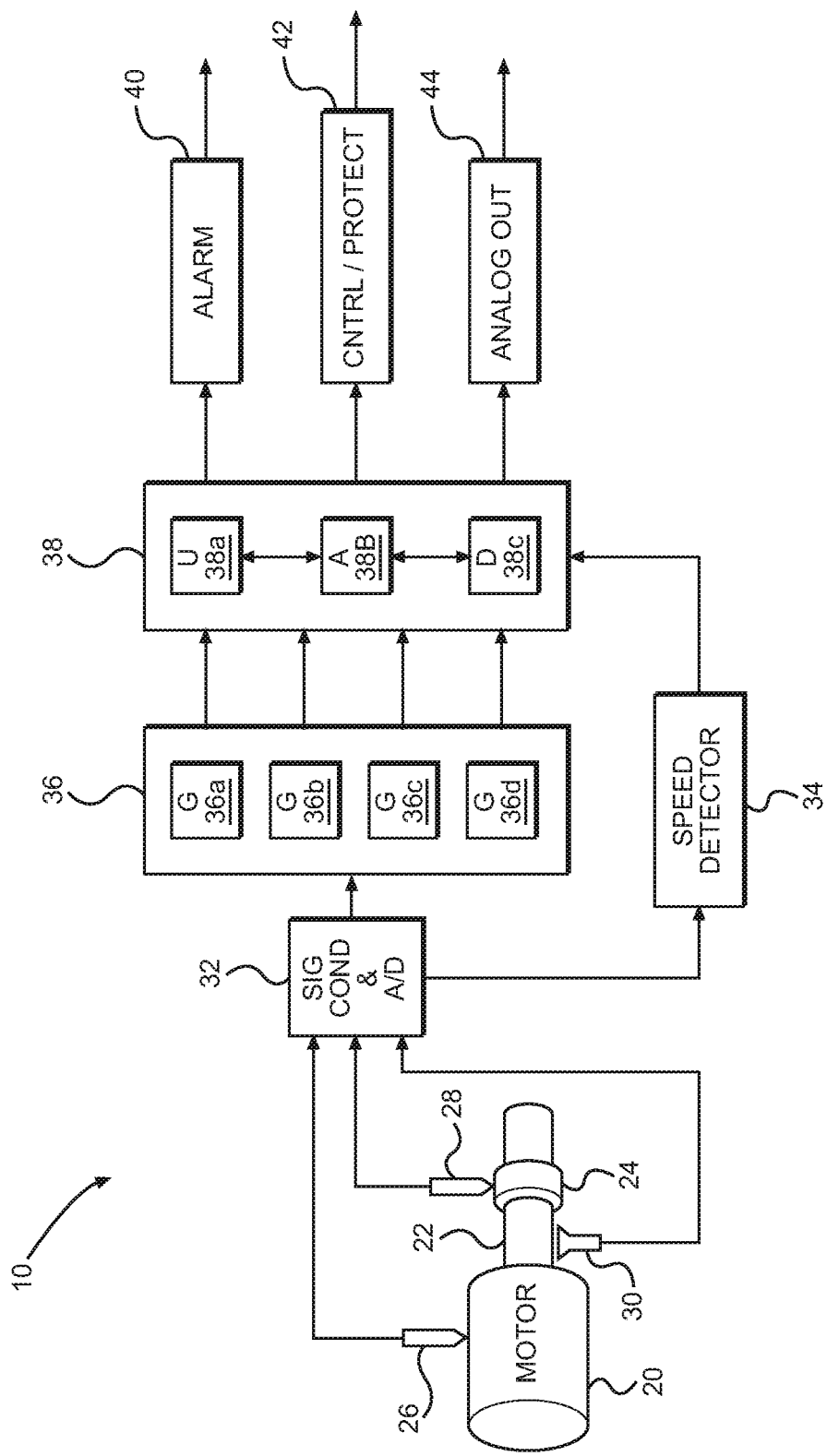
FIG. 1B is a more detailed somewhat diagrammatic block diagram of the apparatus for monitoring an asset of FIG. 1A.

Referring now to the drawings in which like reference characters designate like or corresponding parts throughout the several views, there is shown in FIG. 1 a block diagram of an apparatus for monitoring assets in accordance with the present invention. The apparatus 10 includes a speed detection unit 12, a data acquisition unit 14, a measurement unit 16 and an alarming unit 18. The speed detection unit 12 provides speed signals to the measurement unit 16 and identifies the asset associated with each speed signal. The data acquisition unit 14 collects data related to the assets and provides that data to the measurement unit 16. The data acquisition unit 14 may include a variety of sensors, such as displacement vibration sensors, accelerometers, temperature sensors, voltage sensors, amperage sensors and the like. The data acquisition unit 14 may also include conditioning electronics for preprocessing or conditioning sensor signals which are typically in the analog domain. Thus, the data acquisition unit 14 may include, for example, amplifiers and analog filters. In addition, the data acquisition unit 14 may provide analog to digital conversion of the signals and provide a digital signal for each sensor to the measurement unit 16. Before sending the signal to the measurement unit 16, the data acquisition unit 16 may also perform digital pre-processing of the signal, such as, for example, gain adjustment, filtering, decimation, etc. The measurement unit 16 processes and analyzes the signals for multiple purposes including control, protection, alarming and predictive maintenance. The measurement unit 16 may directly issue alarms, information or commands, or it may transfer data to an alarming unit 18 that will further analyze the data and based on the analysis of the data will issue alarms, information or commands. (The measurement unit 16 and the alarming unit 18 may be also referred to herein as an "analyzer".)

For example, the alarming unit may issue a warning alarm that a shaft is vibrating abnormally, but the level of vibration is insufficient to take immediate action. Alternatively, the alarming unit 18 may determine that a shaft is vibrating at a magnitude and phase that is indicating an immediate danger, and the alarming unit 18 would issue a command to shut down the motor driving the vibrating shaft. The phase information in the filtered signal may provide an indication of abnormal operation even when the magnitude of the filtered signal does not. For example, the phase information will indicate a direction of vibration. If the filtered signal corresponds to the vibration of a rotating shaft that is normally vibrating vertically, the phase information will indicate that direction of vibration. If the rotating shaft begins to vibrate horizontally instead of vertically, the phase will indicate that change, but the magnitude of the vibration may not. Horizontal vibration of this particular shaft may indicate a dangerous operating condition and may require the shutdown of the machinery. Thus, the phase information could be an early warning of a serious condition, and thus it provides valuable information that is not necessarily contained within the amplitude of the vibration. Alternatively, a filtered signal may indicate that the phase of vibration is rapidly changing during normal operations. If the phase of the filtered signal became constant over time, the constant phase would indicate an abnormal operating condition. Thus, the analyzing unit 38b constantly monitors the phase of the filtered signal and may determine that an asset is operating abnormally based upon abnormal phase information for that particular asset.

Referring now to FIG. 1B a somewhat diagrammatic and more detailed view of the monitoring apparatus 10 is shown. In this view, a motor 20 driving a rotating shaft 22 supported by a bearing 24 is shown as an example of an asset that is monitored by the apparatus 10. A vibration sensor 26 monitors the vibration of the motor directly and a vibration sensor 28 monitors the vibration of the bearing 24, and both sensors may be displacement vibration sensors, but other forms of vibration sensors could be used, such as accelerometers that output acceleration or velocity information. A speed sensor 30 detects the rotational speed of the shaft 22, and the sensor 30 may be a Hall effect sensor, a light sensor, or other types of speed sensors. The signals generated by the sensors 26, 28 and 30 are provided to a signal conditioner 32 which includes analog and digital circuits for preprocessing the signals and preparing them for transfer to a Görtzel filter 36 and a speed detector 34. It will be understood that multiple signals from multiple sensors are being provided by the signal conditioner 32, but to simplify, the following discussion may mention only one signal.

In this example, the motor 20 has a normal operating speed of 60 Hz (3600 RPM) and likewise the shaft 22 will normally rotate at a speed of 60 Hz. Thus, a characteristic frequency of both the motor 20 and the shaft 22 is 60 Hz. Since vibration sensor 28 is mounted on the bearing 24, a characteristic frequency to be associated with sensor 28 is 60 Hz. Vibration of the shaft at 60 Hz would be sensed at the bearing 24. However, since the bearing has its own unique physical characteristics, such as the number of rollers in the bearing, it will have other characteristic frequencies that may need to be monitored. So for this example, it will be assumed that the bearing 24 has physical characteristics that will cause it to vibrate at 600 Hz when it is supporting a shaft that is rotating at a rotational speed of 60 Hz. Thus, another characteristic frequency of the bearing 24 would be 600 Hz.

The signals from the sensors 26 and 28 are conditioned and converted to a digital format by the conditioner 32 and transmitted to the Görtzel filter block 36 which includes multiple Görtzel filters that are represented in this embodiment by Görtzel filters 36a-d. In actuality, the filter block 36 will typically have many more than four Görtzel filters. The speed signal from sensor 30 is transmitted through the conditioner 32 to the speed detector 34, which calculates speed information and transmits it to the measurement block 38 which includes, at least, and tracking unit 38a, and analyzer 38b and a deciding unit 38c. The speed data is received by the tracking unit 38a and based in part on the speed of the shaft 22, the tracking unit 38a will transmit coefficients (also called parameters) to the Görtzel filters 36a-36d that are assigned to monitor the condition sensor signals from sensors 26 and 28. For purposes of this example, it will be assumed that multiple Görtzel filters are assigned to receive signals from each of sensors 26 and 28, and two groups of multiple sensors are assigned to monitor the signal from sensor 28. One group looks for a characteristic frequency of 60 Hz and another group looks for a characteristic frequency of 600 Hz. The outputs from the Görtzel filters 36a-36d are transmitted to the measurement block 38 and the deciding unit 38c identifies a single Görtzel filter that most probably represents the vibrations sensed by sensor 26 at the characteristic frequency of the motor 20, and the deciding unit 38c chooses one Görtzel filter that best represents the signal from sensor 28 at a first characteristic frequency of 60 Hz and it chooses a second Görtzel filter that best represents the signal from sensor 28 at a second characteristic frequency of 600 Hz. The signals selected by the deciding unit 38c are analyzed by the analyzer 38b and the output of the analyzer 38b is provided to an alarm unit 40 and a control unit 42 that performs both control and protect functions. Based on the output from analyzer 38b an alarm signal may be generated by alarm unit 40 which informs the operators that one of the assets is operating abnormally, and the operator may make the ultimate decision as to what, if anything, should be done. If the output from the analyzer 38b indicates a more serious condition, control or protect commands may be issued through the control unit 42. For example, a command might be issued to reduce the speed of the motor 20. If the condition is sufficiently serious, a command that might be issued to shut down the motor 20.

In addition, the measurement unit 38 will provide the selected filtered signals to the analog output 44 that will use the amplitude and phase information from the selected Görtzel filters to generate three analog sinusoidal signals representing the vibration of the motor 20 at the characteristic frequency of about 60 Hz, the vibration of the bearing 24 at about 60 Hz and the vibration of bearing 24 at about 600 Hz when the motor 20 is operating at its characteristic speed of about 60 Hz. In this case, the word "about" is used with reference to the frequencies because the motor frequency will vary slightly depending upon circumstances. A sudden heavy load may cause the motor 20 to slow down and a sudden light load may cause the motor 22 speed up. However, when these changes occur, the Görtzel filters will track the new characteristic frequency and continue to provide accurate information at the new characteristic frequency.

Figure 2:
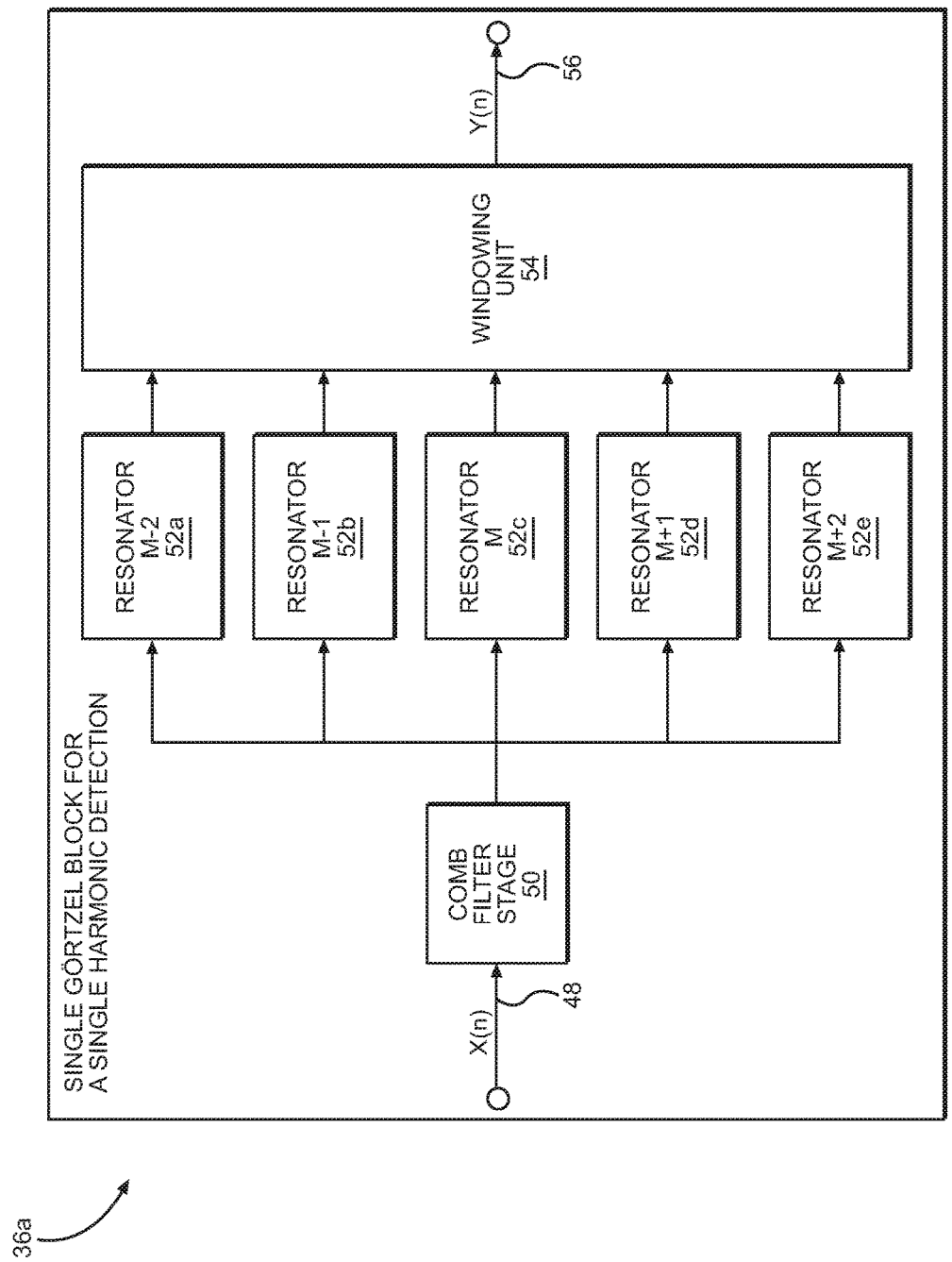
FIG. 2 is a block diagram illustrating the Görtzel filter used in the apparatus for monitoring an asset.

The operation of each of the Görtzel filters 36a-36b is illustrated in the block diagram of FIG. 2. The input to the Görtzel filter 36a is provided on line 48 and will be a conditioned sensor signal, which is initially provided to a comb filter stage 50 whose operating characteristics are controlled by coefficients that are initially set and periodically updated by the tracking unit 38a. For example, if the expected initial characteristic signal is 60 Hz, the comb filter stage 50 will be set to pass a frequency band that includes the expected characteristic signal of 60 Hz and includes a margin of error to ensure that the frequency band is large enough to pass the actual frequency of the characteristic signal. The output of the comb filter stage 30 is provided to each of the resonators 52a-52e, and the operating characteristics of the resonators are set by the tracking unit 38a to pass a frequency band at or near the characteristic frequency. In this example, the characteristic frequency is 60 Hz and the resonator 52c is set to pass a frequency band of one hertz around 60 Hz. Thus resonator 52c will pass frequencies from 60.5 Hz to 59.5 Hz. Resonators 52b and 52a are set to pass a one hertz frequency band around 59 Hz and 58 Hz respectively, and resonators 52d and 52e are set to pass a one hertz frequency band around 61 Hz and 62 Hz, respectively. The outputs from the resonators 52a-52d are supplied to a windowing unit 54 that applies a windowing function, such as a Hanning window, to the outputs, and the output of the windowing unit 54 is applied to line 56 and is the output of the Görtzel filter 36a. Thus, this particular Görtzel filter 36a will generate a frequency domain signal on line 56 representing input signals having a frequency from 57.5 Hz to 62.5 Hz. This example has been simplified for purposes of illustration and is not very realistic. Also, the comb filter 50 is optional and in stable environments it may be desirable to omit the comb filter.

In one embodiment, the outputs of the resonators 52a-52e are applied to the tracking unit 38a, and the magnitudes of those outputs are analyzed by the tracking unit 38a for the purpose of periodically adjusting the coefficients of the resonators. For example, if the tracking unit 38a determined that resonator 52d had a very large output as compared to the outputs of the other resonators, then the tracking unit 38a would determine that the actual operating characteristic frequency was 61 Hz. It would then adjust the coefficients of the resonators so that resonator 52C passes a frequency band of one hertz around 61 Hz, and the remaining resonators are likewise adjusted. Thus, the overall frequency band of the resonators would be from 58.5 Hz to 63.5 Hz and the tracking unit 38a would thereby cause the filter 36a to track the characteristic frequency which is now shifted up to 61 Hz.

Figure 3:
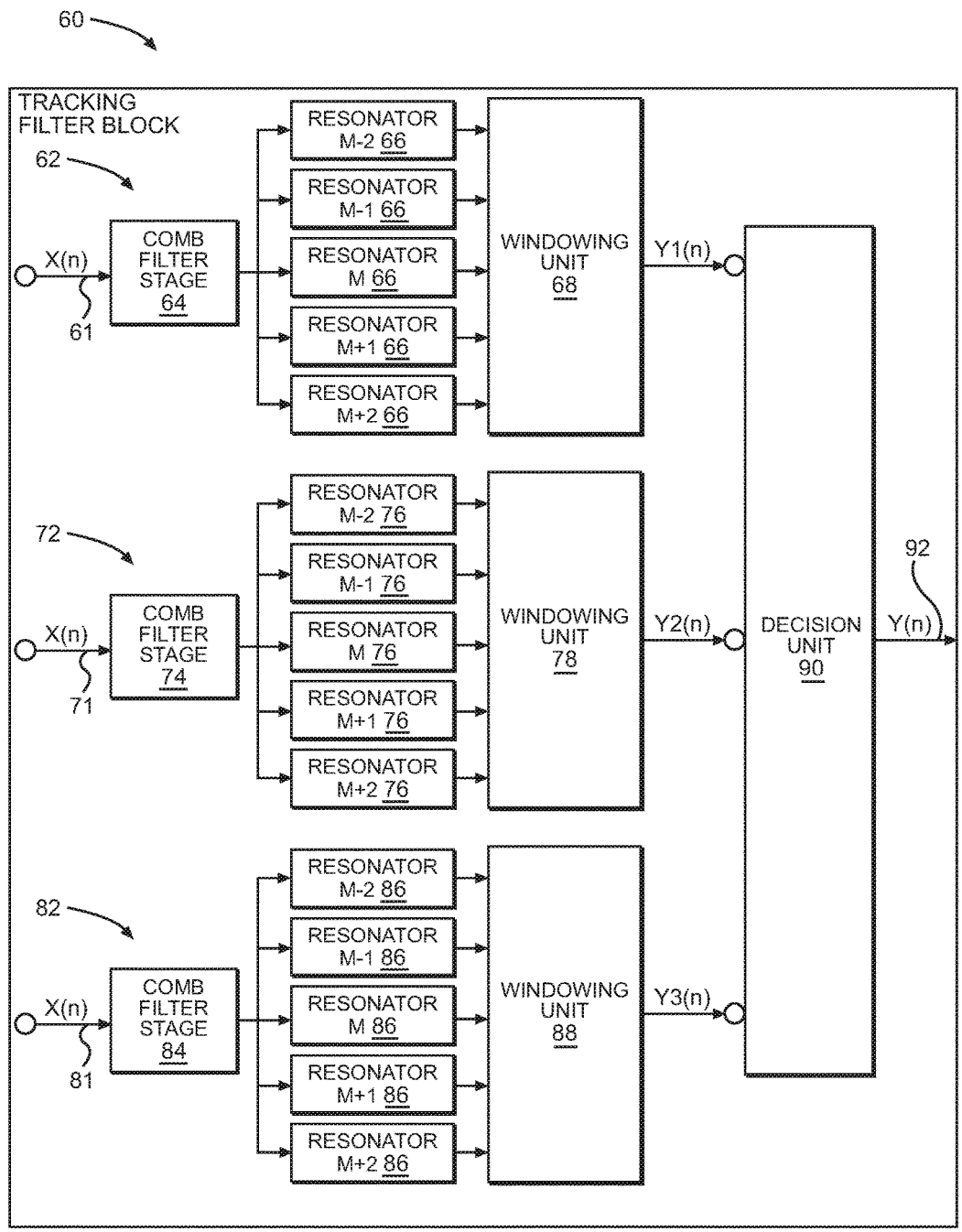
FIG. 3 is a block diagram of a Görtzel filter composed of multiple Görtzel filter blocks, which may be characterized as a tracking filter block.

Referring now to FIG. 3, another example of a tracking filter is shown. In this embodiment a tracking filter block 60 is composed of three Görtzel tracking filters 62, 72 and 82. Each of the filters includes a comb filter stage 64, 74 and 84 receiving an input signal on input lines 61, 71 and 81 (respectively), and the output of each comb filter is applied to five resonators. The output of comb filter 64 is applied to the resonators 66, and the outputs of the resonators 66 are applied to a windowing unit 68. In like manner, the output of the comb filter 74 is applied to the five resonators 76 whose outputs are applied to the input of a windowing unit 78. Finally, the comb filter 84 receives an input on line 81 and provides its output to five resonators 86 whose outputs are provided to the windowing unit 88. Thus, each of the filters 62, 72 and 82 operate in a manner as described with respect to filter 36a as shown in FIG. 2. The outputs of the windowing units 68, 78 and 88 are applied to a decision unit 90 whose output is applied on line 92 as the overall output of the tracking filter block 60. The decision unit 90 is shown as part of the tracking filter block 60, but the decision unit 90 may also be regarded as part of the analyzer since it performs an analyzer formation. Thus in reference to FIGS. 1a and 1b, the decision unit 90 may be regarded as part of measurement unit 16 or measurement unit 38.

In this example, the filter 72 is set to pass a frequency band of one hertz around 60 Hz (59.5 Hz to 60.5 Hz). The filter 62 is set to pass a one hertz frequency band around 61

Hz and filter 82 is set to pass a one hertz frequency band around 59 Hz. The filters 62, 72 and 82 are set to their initial operating conditions by the tracking unit 38*a* as described with respect to the filter 36*a*. The decision unit 90 receives and compares the outputs from filters 62, 72 and 82 and determines which output most probably represents the characteristic frequency signal. In its simplest form, the decision unit 90 would simply choose the filter having the largest output, and that largest output would be applied as the output signal online 92 representing the output of the overall tracking filter block 60. Again, parameters other than magnitude may be used to select the most probable signal. In one exemplary embodiment, if two of the filters had relatively large magnitude outputs and the remaining filter had a relatively small output signal, the decision unit 90 may utilize both signals in determining the output signal online 92. For example, the two signals may be added together and multiplied by a scaling factor. Alternatively, the larger of the two signals may be selected as the most probable signal, but it would be corrected by a scaling factor whose magnitude is determined by the relative magnitudes of the two largest signals from the filters 62, 72 and 82. For example, if the signal from filter 62 had a magnitude of one and the signal for filter 72 had a magnitude of two, the decision unit 90 would choose the signal from filter 72 as the most probable signal and it would multiply that signal by a correction factor of 1.5. However, if the signal from filter 62 had a magnitude of 10 and the signal from filter 72 had a magnitude of nine, a larger correction factor should be used. Thus, the signal from filter 62 would be selected as the most probable signal and it would be multiplied by a correction factor of 1.9. Again the numbers mentioned in this example are unrealistic and have been simplified for purposes of easy illustration.

The tracking unit 38*a* monitors the outputs from resonators 66, 76 and 86 and also monitors the outputs of the windowing unit's 68, 78 and 88 and the output of the decision unit 90. If the filter 72 produces the largest magnitude output and it is selected by decision unit 90 as the most probable signal representing the characteristic frequency signal, the tracking unit 38*a* may decide to not change any of the coefficients of the filters. However, if the output of filter 62 has the largest magnitude and is selected by the decision unit 90, the tracking unit 38*a* will update the coefficients of all filters so that the frequency band of filter 62 becomes the frequency band of filter 72 and the frequency bands of filters 62 and 82 are downshifted. Likewise, if the signal from filter 82 is selected by the decision unit 90, the coefficients of filter 72 will be changed so that it passes the frequency band of filter 82. The frequency bands of filters 62 and 82 will be likewise up shifted. If the outputs of the windowing unit 68 and 78 are almost equal and the decision unit 90 applies a corrective factor to the selected most probable signal, the tracking unit 38*a* will adjust the coefficients of the filter 62, 72 and 82 such that the filter 72 has a center frequency that is the average of the center frequencies of filter 62 and 72. Thus, if filters 62 and 72 have center frequencies of 59 Hz and 60 Hz, the center frequency of filter 72 would be adjusted to 59.5 Hz. In this manner, the tracking unit 38*a* is continuously monitoring the tracking filter block 60 to ensure that the filter 72 has a center frequency that most nearly equals the actual characteristic frequency of the asset being monitored, and the filter 62 and 82 have center frequencies that are shifted below and above the center frequency of filter 72.

The tracking unit 38*a* may also use a calculated speed gradient in changing the coefficients of the tracking filter block 60 or the Görtzel filter 36. The speed gradient may be calculated based on the changing speeds that are reported by the speed detector 34. Or, the speed gradient may be calculated based on the changing center frequency of the characteristic frequency as discussed above. If the speed gradients as calculated by the two different methods are different, the tracking unit 38*a* will choose the more reliable speed gradient for the particular application. In most cases, the changing center frequency of the characteristic frequency of interest is probably the most reliable indicator of the speed gradient. However, if a particularly accurate and reliable speed detector is used, the speed detector signal may be most probably accurate indicator of the speed gradient. The tracking unit 38*a* uses the speed gradient to calculate a future characteristic frequency and set the Görtzel filters 36 or the filter block 60 to the predicted future characteristic frequency. For example, assume a particular signal has a current characteristic frequency of 30 Hz and the Görtzel filters are being updated every second. Also, assume that based on all available information there is an increasing speed gradient of one hertz per second. In such case, the average speed during the next one second will be 30.5 Hz and the tracking unit 38*d* will set the Görtzel filters using 30.5 Hz as the expected characteristic frequency.

Referring again to FIG. 1*b* and FIG. 3, the signal conditioner 32 chooses the signals to be applied as input signals to the Görtzel filters 36. In the above discussion it was assumed that the same input signal was applied to all three Görtzel filters 62, 72 and 82. However, apparatus 10 is sufficiently flexible to have multiple modes of operation. In a second mode of operation the signal conditioner 32 may supply a separate or different input signal to one or more of the filters 62, 72 and 82. For example, the vibration signal from sensor 26 could be applied to filter 62, and filter 62 could be set to a center frequency of 60 Hz, which is the characteristic frequency for the motor 20. The vibration signal from the sensor 28 could be applied to the filters 72 and 82, and filter 72 could be set to a center frequency of 60 Hz, which is one of the characteristic frequencies of the bearing 24. Filter 82 could be set to a center frequency of 600 Hz which is another characteristic frequency of the bearing 24. In this embodiment the decision unit 90 will output all of the signals from the windowing unit 68, 78 and 88. Each of the signals will be applied to the analyzer 38*b* and analyzed to determine whether any action should be taken. Likewise, the signals are each applied through the analog output to provide sinusoidal representations of the three filtered signals. This particular configuration in this particular example illustrates that three filters could be shifted from monitoring one signal in a first mode of operation to monitoring two signals in a second mode of operation. Again, this is a simplified example. An actual application the tracking block filter 60 will include many Görtzel filters, each of which may include a comb filter stage, a plurality of resonators, and a windowing unit. For example, it may include 100 such filters monitoring 50 signals, and the modes of operation may be changed constantly. For example, each of the 50 signals could be initially monitored by two filters. Then, the mode of operation can be changed such that 25 stable signals are monitored by one filter and the remaining less stable 25 signals are monitored by three filters. If one signal becomes particularly unstable or is lost, the tracking unit 38*a* and the signal conditioner 32 could configure 10 filters to monitor the particularly unstable or lost signal on a temporary basis until it is found, becomes more stable, or some protective action is taken, such as the issuance of a shutdown command. After the problem of the unstable signal has been resolved, the 100 filters can return to normal operation with the stable signals being monitored by a single filter and the less stable signals being monitored by multiple filters.

Figure 4:
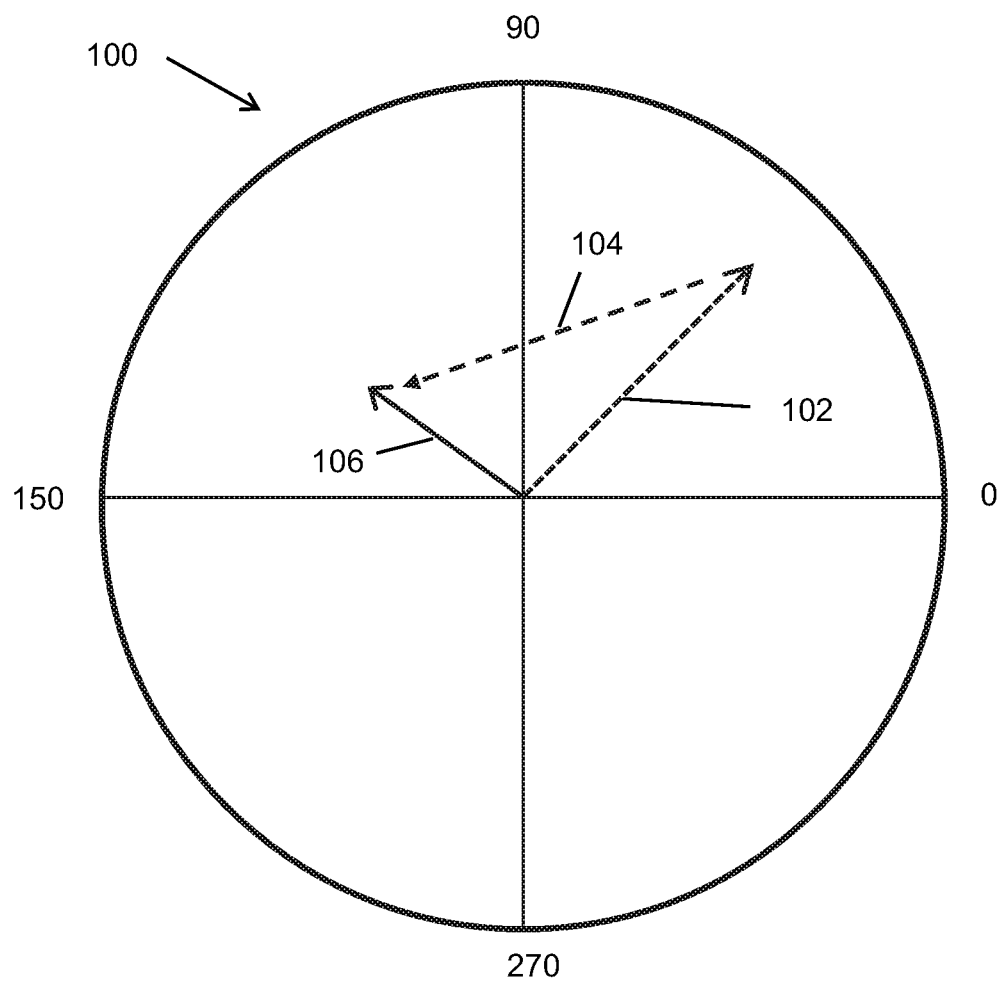
FIG. 4 is a polar diagram of a vibration signal showing a change in the phase and amplitude of the vibration signal.

In the above embodiments, The tracking filter algorithm will actually produce an output in the form of a complex number that may be represented by a real and an imaginary number. For example, the output might be 3+3i. One way to use this output is to simply use the real part of the number (3) and ignore the imaginary part (3i). However, another option is to calculate the overall amplitude and phase angle and output that information. Thus the overall amplitude in this example is:

$$(3^2+3^2)^{1/2}=18^{1/2}=4.243$$

and the phase angle would be 45 degrees. The overall amplitude is an indicator of vibration amplitude of the system in the observed bandwidth and therefore an indirect indicator for the energy in the system. The phase angle is an indicator of a change of overall system response behavior. Thus the amplitude is a good measure of e.g. an increased vibration of the system and may be used to detect an occurring imbalance or eccentricity of a system. Normally an occurring imbalance affects amplitude and phase of the results. But in some cases vibration amplitude may become less but there is a change in phase. Consider for example the polar graph of FIG. 4 in which vibration vector 102 represents the amplitude and phase of the original vibration, and difference vector 104 represents a change in vibration caused by a potential problem. Vibration vector 106 represents the new vibration amplitude and phase after the change. In such case the difference vector 104 gives an indication of the change in system, which could indicate a problem. Comparing the vibration vectors 102 and 106, the magnitude of vibration corresponds to the length of the vectors and the magnitude of vibration was reduced to 50% of the original vibration. However, the phase changed from about 45 degrees to about 120 degrees, which represents a significant change. So, the phase angle is a good measure of a change in the system and may be used to detect changes in system even if the vibration amplitude changes little or goes down.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An apparatus for monitoring an asset that produces multiple physical signals including at least a first physical signal having first and second characteristic frequencies, the apparatus comprising:
    a sensor for sensing the physical signals and for producing a sensor signal corresponding to the physical signals;
    a first Görtzel filter connected to receive the sensor signal and producing a first filtered signal, the Görtzel filter being configured to filter the sensor signal to pass a first selected frequency band around the first characteristic frequency so that the first filtered signal is within the first selected frequency band;
    wherein the first Görtzel filter comprises:
        a plurality of Görtzel filter units, with each unit configured to pass a filter unit band of frequencies around a center frequency and produce an output, the Görtzel filter units including a first unit having a center frequency at the first characteristic frequency, a second unit having a center frequency that is less than the first characteristic frequency and a third unit having a center frequency that is above the first characteristic frequency, and
        a first windowing unit connected to receive the outputs of the first, second and third units and to produce the first filtered signal based on the outputs;
    an analyzer for analyzing the first filtered signal and producing information corresponding to the condition of the asset
    a second Görtzel filter connected to receive the sensor signal and producing a second filtered signal, the second Görtzel filter being configured to filter the sensor signal to pass a second selected frequency band around a second frequency that is proximate to the second characteristic frequency so that the second filtered signal is within the second selected frequency band;
    wherein the second Görtzel filter comprises a plurality of Görtzel filter units, with each unit configured to pass a filter unit band of frequencies around a center frequency to produce an output, the Görtzel filter units including a fourth unit having a center frequency at the second frequency, a fifth unit having a center frequency that is less than the second frequency and a sixth unit having a center frequency that is above the second frequency, and
    a second windowing unit is connected to receive the outputs of the fourth, fifth and sixth units and to produce the second filtered signal based on the outputs of the fourth, fifth and sixth units; and
    wherein the analyzer includes a decision unit receiving the first and second filtered signals and producing a decision unit signal based on the first and second filtered signals, and the analyzer being operable to analyze the decision unit signal to produce information corresponding to the condition of the asset.

2. The apparatus of claim 1 wherein:
    the first window unit is connected to receive and apply a windowing function to the outputs of the first, second and third units and to produce the first filtered signal having a frequency range within the frequency bands of the first, second and third units; and
    the second window unit is connected to receive and apply a windowing function to the outputs of the fourth, fifth and sixth units and to produce the first filtered signal having a frequency range within the frequency bands of the fourth, fifth and sixth units.

3. The apparatus of claim 1 wherein each of the Görtzel filters includes a plurality of parameters that determine the frequencies of the selected frequency band and further comprise a tracking unit for periodically updating the parameters so that each Görtzel filter is periodically updated to track one of the characteristic frequencies.

4. The apparatus of claim 1 wherein the tracking unit periodically updates the parameters based on either time or an analysis of the sensor signal.

5. The apparatus of claim 1 wherein the first Görtzel filter includes:

a first resonator for receiving the sensor signal and being configured to pass a first resonator frequency band to produce a first resonator signal that includes the first characteristic frequency;
a second resonator for receiving the sensor signal and being configured to pass a second resonator frequency band to produce a second resonator signal in a frequency band having frequencies greater than the first characteristic frequency;
a third resonator for receiving the sensor signal and being configured to pass a third resonator frequency band to produce a third resonator signal in a frequency band having frequencies less than the first characteristic frequency; and
a windowing unit for receiving and applying a windowing funtion to the first, second and third resonator signals and for producing a windowing unit signal corresponding to the resonator signals and corresponding to the physical signal at the first characteristic frequency.

6. The apparatus of claim 1 wherein:
the first Görtzel filter comprises a plurality of Görtzel filter blocks including at least a first filter block and a second filter block;
the first Görtzel filter block including:
a first resonator for receiving the sensor signal and being configured to pass a first resonator frequency band to produce a first resonator signal that includes the characteristic frequency;
a second resonator for receiving the sensor signal and being configured to pass a second resonator frequency band to produce a second resonator signal in a frequency band having frequencies greater than the characteristic frequency;
a third resonator for receiving the sensor signal and being configured to pass a third resonator frequency band to produce a third resonator signal in a frequency band having frequencies less than the characteristic frequency; and
a first windowing unit for receiving the first, second and third resonator signals and for producing a first windowing unit signal corresponding to the first, second and third resonator signals;
the second Görtzel filter block including:
a fourth resonator for receiving the sensor signal and being configured to pass a fourth frequency band to produce a fourth resonator signal that includes a first shifted frequency that is frequency shifted from the characteristic frequency by a selected amount;
a fifth resonator for receiving the sensor signal and being configured to pass a fifth frequency band to produce a fifth resonator signal in a frequency band having frequencies greater than the first shifted frequency;
a sixth resonator for receiving the sensor signal and being configured to pass a sixth frequency band to produce a sixth resonator signal in a frequency band having frequencies less than the first shifted frequency; and
a second windowing unit for receiving the fourth, fifth and sixth resonator signals and for producing a second windowing unit signal corresponding to the fourth, fifth and sixth resonator signals; and
further comprising a decision unit receiving the first windowing unit signal and the second windowing unit signal and for producing a decision unit signal corresponding to at least one of the first and second windowing unit signals and corresponding to a particular physical signal at the characteristic frequency.

7. The apparatus of claim 6 wherein the decision unit selects one windowing unit signal that most probably corresponds to the particular physical signal at the characteristic frequency and produces the decision unit signal based on the selected one windowing unit signal.

8. The apparatus of claim 6 wherein the decision unit selects one windowing unit signal that most probably corresponds to the particular physical signal at the characteristic frequency and produces the decision unit signal based on the selected one windowing unit signal and further comprising a tracking unit that updates the operating characteristics of the resonators of all Görtzel filter blocks based at least in part on which windowing unit signal was selected by the decision unit.

9. The apparatus of claim 6 wherein the plurality of filter blocks further comprises a third Görtzel filter block, the third Görtzel filter block including:
a seventh resonator for receiving the sensor signal and being configured to pass a seventh frequency band to produce a seventh resonator signal that includes a second shifted frequency that is frequency shifted from the first shifted frequency and the characteristic frequency by selected amounts;
a eighth resonator for receiving the sensor signal and being configured to pass a eighth frequency band to produce a eighth resonator signal in a frequency band having frequencies greater than the second shifted frequency;
a ninth resonator for receiving the sensor signal and being configured to pass a ninth frequency band to produce a ninth resonator signal in a frequency band having frequencies less than the second shifted frequency; and
a third windowing unit for receiving the seventh, eighth and ninth resonator signals and for producing a third windowing unit signal corresponding to the seventh, eighth and ninth resonator signals; and
the decision unit receiving the first, second and third windowing unit signals and for producing the decision unit signal corresponding to at least one of the first, second and third windowing unit signals and corresponding to a particular physical signal at the characteristic frequency.

10. The apparatus of claim 1 wherein:
the first and second Görtzel filters are configured to produce the first and second filtered signals that include both amplitude and phase information; and
the analyzer is configured to produce information corresponding to the condition of the asset based in part on both the amplitude and the phase information of the first and second filtered signals.

11. The apparatus of claim 1 wherein:
the first and second Görtzel filters are configured to produce the first and second filtered signals that include both amplitude and phase information; and
the analyzer is configured to detect an alarm condition of the asset and produce an alarm signal based on the amplitude and phase information of the first and second filtered signals.

12. The apparatus of claim 1 wherein each Görtzel filter further comprises a comb filter, a plurality of resonators and a windowing unit.

13. The apparatus of claim 1 further comprising an output generator for receiving the first and second filtered signals and generating first and second sinusoidal output signals corresponding to both the amplitudes and phases of first and second filtered signals.

14. The apparatus of claim 1, wherein
the sensor includes:
a first sensor for sensing at least one of the physical signals and for producing a first sensor signal corresponding to the physical signals;
a second sensor for sensing at least one of the physical signals and for producing a second sensor signal corresponding to the physical signals;
and wherein:
the first Görtzel filter is connected to receive a first input signal and for applying a Görtzel filter function to the first input signal to produce the first filtered signal, the Görtzel filter being configured to filter the first input signal to pass the first selected frequency band so that the first filtered signal has frequencies within the first selected frequency band;
the second Görtzel filter is connected to receive a second input signal and for applying a Görtzel filter function to the second input signal to produce the second filtered signal, the Görtzel filter being configured to filter the second input signal to pass the second selected frequency band so that the second filtered signal has frequencies within the second selected frequency band;
the first and second Görtzel filters having:
a first mode of operation in which both Görtzel filters are connected to receive the first sensor signal, and
a second mode of operation in which the first Görtzel filter is connected to receive the first sensor signal and the second Görtzel filter is connected to receive the second sensor signal; and
the analyzer is configured for analyzing the first and second filtered signals, the analyzer having first and second modes of operation corresponding to the first and second modes of operation of the Görtzel filters, wherein:
in the first mode of operation, the analyzer selects one of the first and second filtered signals to produce a selected signal that most probably corresponds to the physical signal sensed by the first sensor and for analyzing the selected signal, and
in the second mode of operation, the analyzer analyzes the first and second filtered signals separately to produce first information corresponding to the physical signals sensed by the first sensor and to produce second information corresponding to the physical signals sensed by the second sensor.

15. The apparatus of claim 1 further comprising:
a speed detector for detecting the speed of the moving asset and producing a speed signal that corresponds to the speed of the asset;
the first and second Görtzel filters including a plurality of parameters that determines the frequencies of the first and second selected frequency bands;
a tracking unit for receiving the speed signal and for periodically updating the parameters based on the speed signal.

16. The apparatus of claim 15 wherein the tracking unit calculates an expected speed gradient based on the speed signal, the speed gradient corresponding to the rate at which the speed of the moving asset is expected to change and wherein the tracking unit updates the parameters of each Görtzel filter based in part on the expected speed gradient.

17. The apparatus of claim 15 wherein the tracking unit updates the parameters each time a new speed signal is detected.

18. The apparatus of claim 15 wherein the tracking unit analyzes the speed signal to determine when the speed of the asset changes and updates the parameters each time the speed of the asset changes.

19. The apparatus of claim 15 wherein the sensor signal comprises a plurality of signal samples and wherein the tracking unit counts the number of signal samples and periodically updates the parameters of each Görtzel filter after a selected number of samples has been counted.

20. The apparatus of claim 1 wherein:
the first and second Görtzel filters are configured to produce first and second complex filtered signals that each include both amplitude and phase information in a complex form that includes both real and imaginary numbers; and
the analyzer is configured to output the first and second complex filtered signals.

21. The apparatus of claim 1 wherein the first window unit applies a window function to the outputs of the first, second and third units and the second filter unit applies a window function to the outputs of the fourth, fifth and sixth units.

22. The apparatus of claim 1 wherein the windowing function is a Hanning window.

* * * * *